(12) United States Patent
Gardner et al.

(10) Patent No.: US 6,204,130 B1
(45) Date of Patent: Mar. 20, 2001

(54) SEMICONDUCTOR DEVICE HAVING REDUCED POLYSILICON GATE ELECTRODE WIDTH AND METHOD OF MANUFACTURE THEREOF

(75) Inventors: Mark I. Gardner, Cedar Creek; Mark C. Gilmer, Austin, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/924,455

(22) Filed: Aug. 29, 1997

(51) Int. Cl.[7] ............ H01L 21/336; H01L 21/3205; H01L 21/4763
(52) U.S. Cl. ............ 438/287; 438/303; 438/305; 438/585; 438/595
(58) Field of Search ................ 438/303, 305, 438/585, 595, 787, 287

(56) References Cited

U.S. PATENT DOCUMENTS 4,869,781 * 9/1989 Euen et al. .
5,476,802 * 12/1995 Yamazaki et al. .
5,650,649 7/1997 Tsukiji .
5,858,843 * 1/1999 Doyle et al. .
5,891,809 * 4/1999 Chau et al. .

\* cited by examiner

*Primary Examiner*—Savitri Mulpuri
*Assistant Examiner*—Ron Pompey

(57) ABSTRACT

A semiconductor device having a reduced polysilicon gate electrode width and a process for manufacturing such a device is provided. Consistent with the present invention a semiconductor device is formed by forming an insulating film selective to oxide etchant over a substrate. At least one polysilicon block is formed over the insulating film. The polysilicon block is oxidized to grow an oxide layer on exposed surfaces of the polysilicon block and thereby reduce the width of the polysilicon block. The oxide layer is then removed to form a gate electrode with the remaining portion of the polysilicon block. In this manner, gate electrodes having widths smaller than the resolution of current etching techniques can be formed. In accordance with one aspect of the invention, the polysilicon gate electrode has a width less than about 0.15 microns. In accordance with another aspect, the insulating layer selective to oxide etchant is formed from a high permittivity material, such as a barium strontium titanate oxide.

14 Claims, 3 Drawing Sheets

SEMICONDUCTOR DEVICE HAVING REDUCED POLYSILICON GATE ELECTRODE WIDTH AND METHOD OF MANUFACTURE THEREOF

FIELD OF THE INVENTION

The present invention is directed generally to semiconductor devices and, more particularly, to a semiconductor device having reduced polysilicon gate electrode width and method of manufacture thereof.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 101, which acts as a conductor, to which an input signal is typically applied via a gate terminal (not shown). Heavily doped source 103 and drain 105 regions are formed in a semiconductor substrate 107 and are respectively connected to source and drain terminals (not shown). A channel region 109 is formed in the semiconductor substrate 107 beneath the gate electrode 101 and separates the source 103 and drain 105 regions. The channel is typically lightly doped with a dopant type opposite to that of the source 103 and drain 105 regions. The gate electrode 101 is physically separated from the semiconductor substrate 107 by a gate insulating layer 111, typically an oxide layer such as $SiO_2$. The insulating layer 111 is provided to prevent current from flowing between the gate electrode 101 and the semiconductor source region 103, drain region 105 or channel region 109.

In operation, an output voltage is typically developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner an electric field controls the current flow through the channel region 109. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

One important step in the manufacture of MOS devices is the fabrication of the gate electrode. The gate electrode is typically formed by depositing a layer of polysilicon and selectively removing portions of the polysilicon layer, using well-known photolithography and etching techniques. These conventional techniques for forming gate electrodes however impose limitations on the minimum width of the gate electrode. The resolution of the photolithography process, in particular, imposes limitations on the minimum width of the gate electrode. As the thresholds for minimum thickness are reached, the ability to further scale down the semiconductor devices is hindered.

SUMMARY OF THE INVENTION

Generally, the present invention relates to a semiconductor device having a reduced polysilicon gate electrode width and a process for manufacturing such a device. Consistent with the present invention a semiconductor device is formed by forming an insulating film selective to an oxide etchant over a substrate. At least one polysilicon block is formed over the insulating film. The polysilicon block is then oxidized to form an oxide layer on exposed surfaces of the polysilicon block and reduce the width of the polysilicon block. The oxide layer is then removed to form a gate electrode from the remaining portion of the polysilicon block. In this manner, the initial width of a polysilicon block can be reduced to form a narrow gate electrode. This, for example, allows the formation of gate electrodes having widths smaller than the minimum resolution of current etching techniques.

A semiconductor device consistent with an embodiment of the invention includes a substrate and an insulating film selective to an oxide etchant disposed over the substrate. At least one polysilicon gate electrode is disposed over the insulating film. In accordance with one aspect of the invention, the polysilicon gate has a width of about 0.10 microns or less. In accordance with another aspect, the insulating layer selective to oxide etchant is formed from a high permittivity material, such as a barium strontium titanate oxide.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
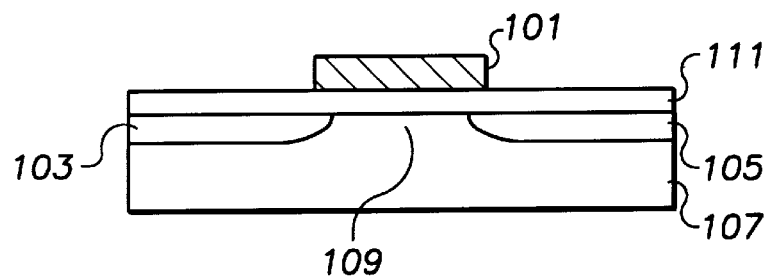
FIG. 1 illustrates components of a typical MOS semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices which have a polysilicon gate electrode disposed on a gate insulating layer. The invention has been found to be particularly advantageous in application environments where it is desirable to form a polysilicon gate electrode in a MOS device. While the present invention is not so limited, an appreciation of various aspects of the invention is best gained through a discussion of various application examples of processes used to form such semiconductor devices.

Figure 2A:
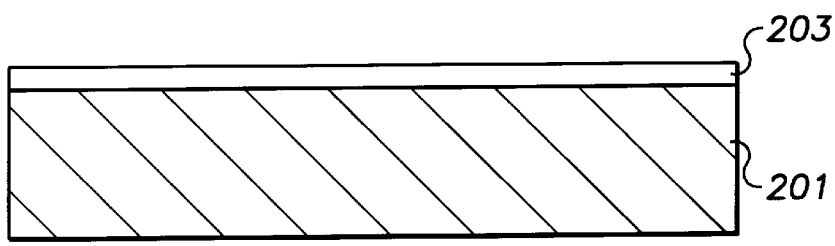
FIGS. 2A through 2I illustrate a fabrication process in accordance with one exemplary embodiment of the invention.

With reference to FIGS. 2A–2I, one exemplary process for forming a semiconductor device having a reduced width polysilicon gate electrode will be described. In FIG. 2A, a thin insulating layer 203 is formed over a silicon substrate 201. In the example embodiment, the thin insulating layer 203 is an oxide, such as silicon dioxide. In one particular embodiment, a thin silicon dioxide insulating layer (5 to 15 angstroms or less thick) is formed by annealing a native oxide growth. The thin insulating layer 203 is used to buffer the silicon substrate 201 from a second insulating layer discussed below. The thickness of the thin insulating layer 203 is typically minimized while taking into consideration reliability concerns. Suitable thicknesses range from about 5 to 15 angstroms (Å) for many applications.

In other embodiments, the thin insulating layer 203 may be a nitrogen bearing oxide. A nitrogen bearing oxide may, for example, be formed by annealing the substrate in a nitrogen and oxygen bearing ambient. Alternatively, a nitrogen bearing oxide may be formed by implanting nitrogen in the substrate and annealing the substrate in an oxygen and/or nitrogen bearing ambient. In yet another embodiment, the thin insulating layer 203 may be a silicon nitride, formed using, for example, jet nitride deposition.

In other embodiments, the need or desire to buffer the silicon substrate from a second insulating layer may not be present. In such instances, the thin insulating layer 203 may be omitted and the second insulating layer formed directly on the substrate 201.

Figure 2B:
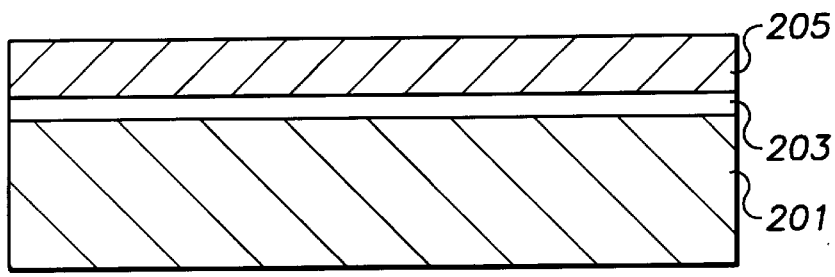

Continuing with the example embodiment, a second insulating layer 205 is formed over the thin insulating layer 203, as illustrated in FIG. 2B. The second insulating layer 205 may be formed from a number of different materials which are selective to an oxide etchant (i.e., materials which are not substantially removed by an oxide etchant). Exemplary materials include, for example, barium strontium titanate (BST) oxide ($Ba_{1-x}Sr_xO_3$) and silicon nitride, each of which are selective to commonly used oxide etchants, such as plasma-chemistry and wet etchants. The second insulating layer may be formed using a number of different deposition techniques. In one particular embodiment, a BST oxide insulating layer 205 is formed over the thin insulating layer using, for example, a metal-organic chemical vapor deposition, jet vapor deposition, or RF sputtering technique.

The second insulating layer 205 will be used in forming a reduced width polysilicon gate electrode, as will be discussed further below. The second insulating layer 205 will also be used to insulate the polysilicon gate electrode from the substrate 201. The thickness of the second insulating layer 205 is selected in consideration of the desired separation between the gate electrode and the substrate 201 as well as in consideration of reliability concerns. When the insulating layer 205 is formed using a BST oxide, thicknesses ranging from about 200 to 3000 Å would be suitable for many applications.

BST oxide is a high permittivity material having a dielectric constant much greater than that of $SiO_2$ (which has a dielectric constant of about 4.2). Typically, the dielectric constant of BST oxide ranges between 20 and 300. In an example embodiment, 600 to 2000 Å of BST oxide having the equivalent thickness of 8 to 27 Å of $SiO_2$ is used as the second insulating layer 205. When used in conjunction with a thin insulating layer 203 consisting of 5 to 15 Å of $SiO_2$, the resultant composite gate insulating thickness is equivalent to 13 to 42 Å of $SiO_2$.

Figure 2C:
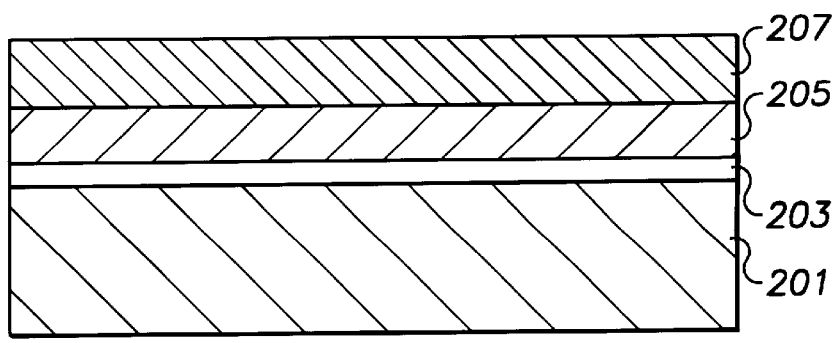

A polysilicon layer 207 is formed over the second insulating layer 205. The resultant structure is illustrated in FIG. 2C. The polysilicon layer 207 may be formed by, for example, depositing polysilicon using well-known techniques. The polysilicon layer 207 will be used to form one or more gate electrodes. The process used to form the gate electrodes generally reduces the thickness of the polysilicon layer, as will be discussed below. Accordingly, the thickness of the polysilicon layer is selected in consideration of the desired final thickness of the gate electrodes. Polysilicon layer thicknesses ranging from about 1000 to 3000 Å would be suitable for many applications.

Figure 2D:
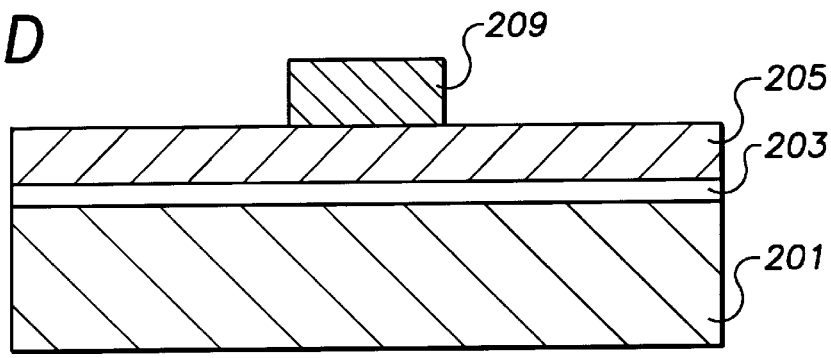

Portions of the polysilicon layer 207 are selectively removed to form polysilicon blocks (only one of which is shown), as illustrated in FIG. 2D. As will be discussed below, the polysilicon block 209 will be scaled down to form a gate electrode. Removal of the polysilicon layer 207 may be performed using, for example, well-known photolithography techniques. Generally, this involves forming a photoresist layer over the polysilicon layer 207 and developing the photoresist to form openings therein. Portions of the polysilicon layer 207 exposed by the openings are removed to form the polysilicon block 209. It should be appreciated that the minimum width of the polysilicon block 209 is limited by the resolution of the photolithography or etching equipment used. For example, at present, the minimum resolution of such equipment (and thus the minimum width of the polysilicon block 209) is about 0.15 microns. However, further reductions in photolithography and/or etching techniques are anticipated and are intended to be covered by the present invention.

Figure 2E:
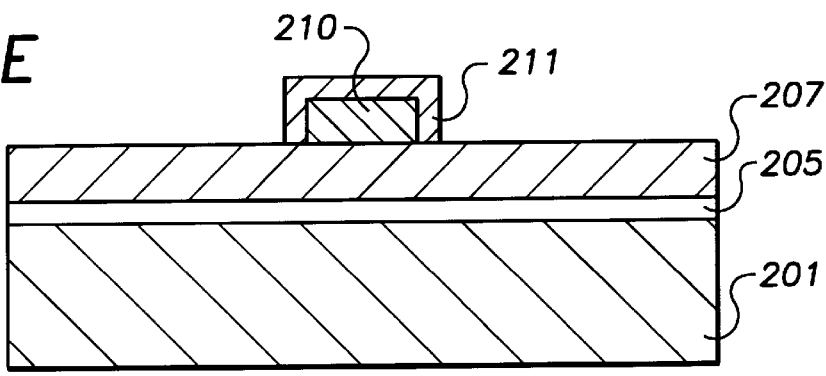

The polysilicon block 209 is oxidized in an oxygen bearing ambient (e.g., $O_2$ and/or $H_2O$). The oxidation generally forms an oxide layer 211 on exposed surfaces of the polysilicon block 209 by consuming a portion of the polysilicon block 209. The resultant structure is depicted in FIG. 2E. The oxidation of the polysilicon block 209 may be performed using a number of different known oxidation techniques including, for example, thermal oxidation. As will be discussed below, the remaining portion 210 of the polysilicon block 209 is used as a gate electrode.

While the oxide layer growth/polysilicon consumption rate can vary with the processing employed, generally the ratio of oxide growth to polysilicon consumption can be approximated at about 2:1 (i.e., for every 2 units of oxide formed, 1 unit of polysilicon is consumed). The thickness of the oxide layer 211 (and thus the reduction in polysilicon block width) is suitably selected in consideration of the desired final thickness of the remaining portion 210 of the polysilicon block 209 (i.e., the thickness of the gate electrode to be formed).

By way of example, the width of the polysilicon block may be reduced by ⅓, ½ or even ⅔. Beginning with a 0.15 micron polysilicon block 209, the width can be reduced to 0.10 microns (i.e., by ⅓) by growing a 500 Å oxide layer 211. This reduces the width of the polysilicon block 209 by 250 Å (i.e., 0.025 microns) on each side, corresponding to an overall width reduction of 500 Å (or 0.05 microns). Similarly, a 0.15 micron polysilicon block 209 can be reduced to 0.05 microns by growing 1000 Å (or 0.1 microns) of oxide on each side of the polysilicon block. The invention however is not limited to the particular width reductions illustrated above. For example, the width of the polysilicon block 209 may be reduced by less than ¼ or more than ⅔, if desired.

Figure 2F:
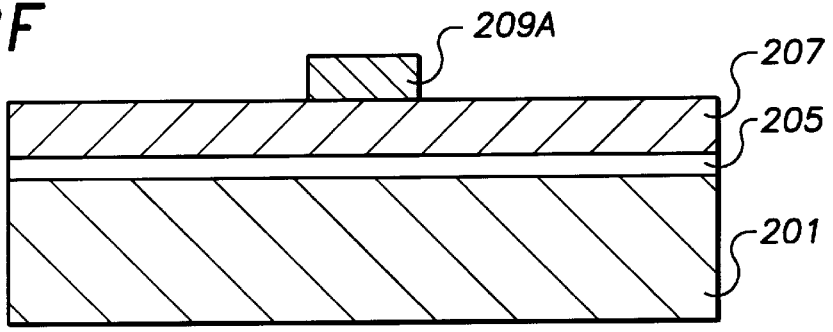

The oxide layer 211 is removed to form a reduced width gate electrode 209A from the remaining portion 210 of the polysilicon block 209, as illustrated in FIG. 2F. Removal of the oxide layer 211 is performed using oxide etchants which are selective to (i.e., which do not substantially remove) the insulating layer 205. Accordingly, the oxide etchant used can vary with the type of insulating layer employed. With BST oxide or silicon nitride insulating layers 205, oxide etchants, such as plasma-chemistry etchants and wet etchants, may be employed. In one particular embodiment, the oxide layer 211 is removed by applying a 10:1 HF (hydrofluoric acid) oxide etchant. The use of a second insulating layer 205 selective to an oxide etchant allows the oxide layer 211 to be removed without undercutting the gate electrode 209A (i.e., without removing portions of the second insulating layer 205 beneath the gate electrode 209A).

Portions of the insulating layer 203 adjacent the gate electrode 209A are removed to expose active regions of the substrate 201. The resultant structure, illustrated in FIG. 2G, generally includes a gate electrode stack 217 (defined by the gate electrode 209A, and insulating layers 203A and 205A). Removal of the insulating layer 205 may be done using, for example, well-known techniques. BST oxide, in particular, can be removed using plasma-chemistry technique.

Figure 2G:
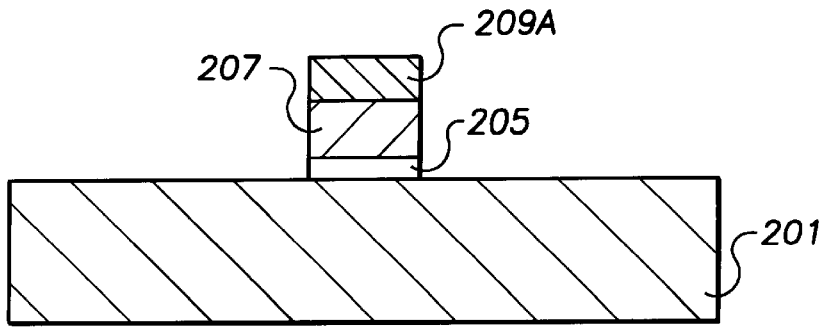
Figure 2H:
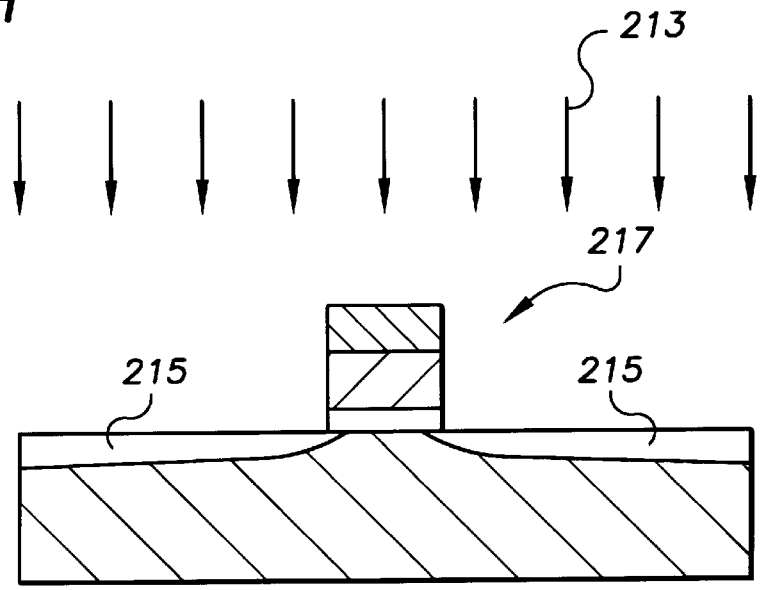
Figure 2I:
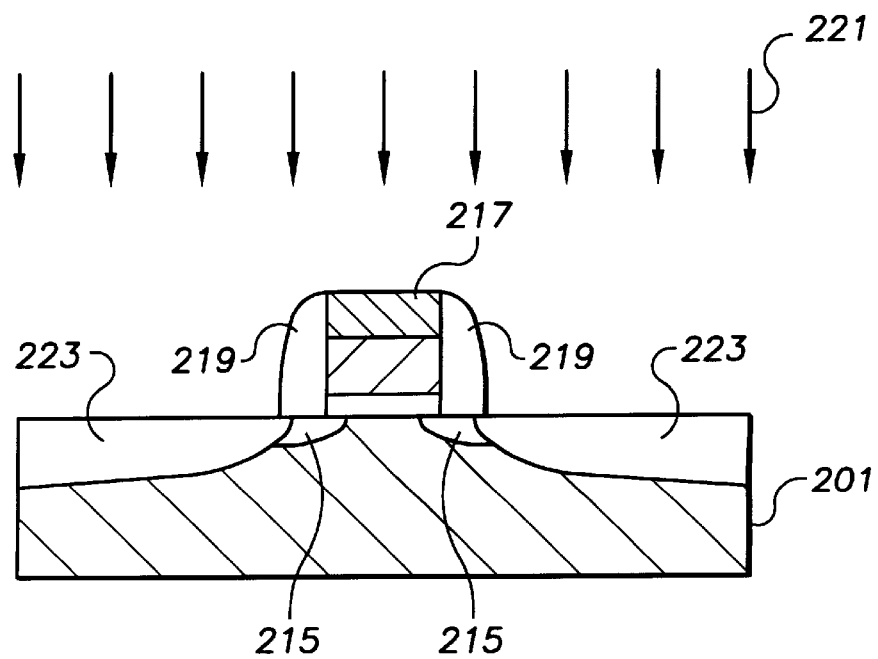

Fabrication may continue with well-known processes, such as spacer formation, source/drain implants, silicidation, and contact formation to form the ultimate device structure. By way of example and not of limitation, an exemplary process illustrating the formation of an LDD (lightly-doped drain) device is illustrated in FIGS. 2H–2I. In FIG. 2H, a relatively shallow implant of a doping agent 213 (such as boron or arsenic) is performed to form lightly doped regions 215 in the substrate 201. The shallow implant may be performed using known dosages, implant energies, and implant techniques.

Following the shallow dopant implant, spacers 219 are formed on the sidewalls of the gate electrode stack 217. Using the spacers 219 for alignment, a relatively high dose implant of a doping agent 221 is performed to form heavily-doped regions 223 in the substrate 201. Together each heavily-doped region 223 and lightly-doped region 215 forms an LDD source/drain region.

Using the above process, semiconductor devices having polysilicon gate electrodes with minimum widths can be formed. Moreover, using oxidation to reduce polysilicon gate widths allows for enhanced control over the resultant reduced width gate electrode. In particular, the width of the polysilicon gate electrode can be reduced below the minimum resolution of the photolithography or etching equipment employed. For example, using 0.15 micron resolution photolithography equipment, gate electrodes having widths of 0.10 microns or 0.05 microns can be formed. This allows for further scaling down of device dimensions and concomitant increases in device performance. For example, reduced gate widths allow for reduced channel lengths and faster device performance.

Furthermore, additional advantages are attained by using a relatively high permittivity material (as compared to $SiO_2$), that is selective to oxide etchant, as the second insulating layer 205. In particular, the use of a high permittivity insulating layer 205 enhances device performance by, for example, increasing drive current.

As noted above, the present invention is applicable to fabrication of a number of different devices where the advantages of reduced width gate electrodes are desired. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A process of forming a semiconductor device, comprising:

forming a thin oxide layer over a substrate, including annealing a native oxide layer;

forming an insulative film selective to an oxide etchant on the thin oxide layer, the insulative film having a dielectric constant greater than 20;

forming at least one polysilicon block on the insulating film, the polysilicon block having a width;

oxidizing the polysilicon block to form an oxide layer on the polysilicon block and reduce the width of the polysilicon block; and removing the oxide layer on the polysilicon block to form a gate electrode.

2. The process of claim 1, wherein removing the oxide layer leaves the insulating film intact.

3. The process of claim 1, wherein the thin oxide has a thickness ranging from 5 to 15 angstroms.

4. The process of claim 1, wherein the insulating film has a dielectric constant greater than 40.

5. The process of claim 1, wherein the insulating film has a dielectric constant around 200.

6. The process of claim 1, wherein forming the at least one polysilicon block the insulating film includes:

forming a polysilicon layer on the insulating film; and selectively removing portions of the polysilicon layer.

7. The process of claim 1, wherein the width of the polysilicon block is reduced by at least a quarter.

8. The process of claim 1, wherein the width of the polysilicon block is reduced by at least ⅔.

9. The process of claim 1, wherein the width of the polysilicon gate is reduced by at least a half.

10. The process of claim 1, wherein the width of the polysilicon gate is reduced to less than 0.1 microns.

11. The process of claim 1, wherein removing the oxide layer includes etching the oxide layer.

12. The process of claim 4, wherein the oxide layer is etched using an HF dip.

13. The process of claim 1, further including removing portions of the insulating layer adjacent the gate electrode after removing the oxide layer.

14. A process of forming a semiconductor device, comprising:

forming a thin oxide layer on a substrate, including annealing a native oxide layer;

forming a barium strontium tantalate (BST) oxide layer on the thin oxide layer, the BST layer having a dielectric constant greater than 20;

forming at least one polysilicon block on the BST oxide layer, the polysilicon block having a width;

oxidizing the polysilicon block to grow an oxide layer on the polysilicon block, the oxide layer growth consuming a portion of the polysilicon block and thereby reducing the width of the polysilicon block; and removing the oxide layer on the polysilicon block to form a gate electrode while leaving the BST oxide layer intact.

* * * * *

UNITED STATES PATENT AND TRADEMARK OFFICE
CERTIFICATE OF CORRECTION

PATENT NO.   : 6,204,130 B1
DATED        : March 20, 2001
INVENTOR(S)  : Gardner et al.

It is certified that error appears in the above-identified patent and that said Letters Patent is hereby corrected as shown below:

Drawings,
Figure 2E: "207" should read -- 205 --.
Figure 2E: "205" should read -- 203 --.
Figure 2F: "207" should read -- 205 --.
Figure 2F: "205" should read -- 203 --.
Figure 2G: "207" should read -- 205A --.
Figure 2G: "205" should read -- 203A --.
Figure 2G: please insert the upper left of the figure -- 217 -- with an arrow directed toward the stack (top portion of Figure 2G).

Column 6,
Line 44, "claim 4" should read -- claim 11 --.

Signed and Sealed this

Fifteenth Day of July, 2003

JAMES E. ROGAN
*Director of the United States Patent and Trademark Office*